(12) United States Patent
Lachaize

(10) Patent No.: US 10,429,432 B2
(45) Date of Patent: Oct. 1, 2019

(54) METHOD FOR DETECTING A FAULTY CONNECTION OF AN AUXILIARY BATTERY

(71) Applicants: CONTINENTAL AUTOMOTIVE FRANCE, Toulouse (FR); CONTINENTAL AUTOMOTIVE GmbH, Hannover (DE)

(72) Inventor: Jerome Lachaize, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 490 days.

(21) Appl. No.: 14/844,761

(22) Filed: Sep. 3, 2015

(65) Prior Publication Data

US 2016/0069945 A1    Mar. 10, 2016

(30) Foreign Application Priority Data

Sep. 10, 2014    (FR) ...................................... 14 58460

(51) Int. Cl.
*G01R 31/04*    (2006.01)
*G01R 31/36*    (2019.01)
(Continued)

(52) U.S. Cl.
CPC ............ *G01R 31/043* (2013.01); *B60L 58/10* (2019.02); *B60W 10/26* (2013.01); *B60W 20/50* (2013.01);
(Continued)

(58) Field of Classification Search
CPC ............................ G01R 31/043; B60L 11/851
(Continued)

(56) References Cited

U.S. PATENT DOCUMENTS 5,519,383 A * 5/1996 De La Rosa .... G01R 19/16542
320/DIG. 21
6,194,877 B1 * 2/2001 Judge .................... H02J 7/1461
320/162
(Continued)

FOREIGN PATENT DOCUMENTS

CN          1614854        5/2005
CN      102088197 A        6/2011
(Continued)

OTHER PUBLICATIONS

French Search Report, dated May 26, 2015, for corresponding French Application.

*Primary Examiner* — Richard Isla
*Assistant Examiner* — Johali A Torres Ruiz
(74) *Attorney, Agent, or Firm* — Young & Thompson

(57) ABSTRACT

A method for detecting a faulty connection of an auxiliary battery (6) incorporated in an auxiliary network (5) of a motor vehicle supplied by the auxiliary battery and by a non-reversible current source (4), such as a DC/DC voltage converter or an alternator, which is voltage controlled to supply an output voltage which is a function of the setpoint voltages. The detection method includes determining at least one minimum and/or maximum voltage value which cannot be reached by the voltage at the terminals of the auxiliary battery (6), then assigning the function of setpoint value to the minimum and/or maximum voltage value, controlling the current source (4) by sending the setpoint value to it, measuring the voltage at the terminals of the auxiliary network (5), and deducing a faulty connection of the auxiliary battery (6) if there is a match between the measured voltage and the setpoint voltage.

10 Claims, 2 Drawing Sheets

(51) Int. Cl.
*B60W 10/26* (2006.01)
*B60W 20/50* (2016.01)
*G01R 31/3842* (2019.01)
*G01R 31/3835* (2019.01)
*B60L 58/10* (2019.01)

(52) U.S. Cl.
CPC ......... *G01R 31/36* (2013.01); *G01R 31/3835* (2019.01); *G01R 31/3842* (2019.01)

(58) Field of Classification Search
USPC .......................................... 324/426; 320/109
See application file for complete search history.

(56) References Cited

U.S. PATENT DOCUMENTS

| | | |
|---|---|---|
| 2003/0042872 A1 | 3/2003 | Larson |
| 2006/0006845 A1 | 1/2006 | Aoyama |
| 2006/0055378 A1* | 3/2006 | Bauerle .................... H02J 7/14 |
| | | 322/28 |
| 2007/0114976 A1* | 5/2007 | Inokuchi ............... H02J 7/1461 |
| | | 322/28 |
| 2009/0130542 A1 | 5/2009 | Mizoguchi et al. |
| 2011/0133694 A1 | 6/2011 | Song |
| 2011/0133721 A1 | 6/2011 | Tsujiko et al. |
| 2012/0187908 A1 | 7/2012 | Tanigawa et al. |
| 2013/0038333 A1 | 2/2013 | Harada |
| 2013/0342163 A1 | 12/2013 | Naruse |
| 2014/0188315 A1 | 7/2014 | Kang et al. |
| 2015/0084409 A1 | 3/2015 | Song |

FOREIGN PATENT DOCUMENTS

| | | |
|---|---|---|
| CN | 103516012 | 1/2014 |
| JP | 2006-214978 A | 8/2006 |
| JP | 2013-224070 A | 10/2013 |
| KR | 10-1028020 B1 | 4/2011 |
| WO | 2009/156825 A1 | 12/2009 |
| WO | 2011/132268 A1 | 10/2011 |

* cited by examiner

METHOD FOR DETECTING A FAULTY CONNECTION OF AN AUXILIARY BATTERY

FIELD OF THE INVENTION

The invention relates to a method for detecting a faulty connection of a low-voltage auxiliary battery incorporated in an auxiliary network of a motor vehicle supplied by said auxiliary battery and by a non-reversible voltage-controlled current source, such as a DC/DC voltage converter or an alternator.

BACKGROUND OF THE INVENTION

Electric and hybrid motor vehicles, notably, usually have a first voltage source supplying a primary circuit with direct current and a second voltage source consisting of a battery, called the auxiliary battery, supplying a secondary circuit forming the auxiliary network, said primary and secondary circuits being connected to one another by a non-reversible voltage-controlled current source, usually consisting of a DC/DC voltage converter.

Hybrid vehicles of the "micro-hybrid" type have two power sources incorporated in the auxiliary network, namely a non-reversible voltage-controlled current source consisting of an alternator, and a voltage source consisting of an auxiliary battery.

The auxiliary network of any of these vehicles is therefore supplied by an auxiliary battery and by a non-reversible voltage-controlled current source, so that, if there is a faulty connection of the auxiliary battery, the power supply to the auxiliary network is provided by the current source.

Developments have now taken place with a view to reducing energy consumption, by causing the supply from the current source to be cut off in specific operating states of vehicles; consequently, in order to provide these cut-offs without cutting off the whole power supply, it is essential to be able to ensure that there is no faulty connection of the auxiliary battery.

SUMMARY OF THE INVENTION

The present invention is intended, notably, to provide a solution to this problem, and has the primary object of providing a reliable method for detecting a faulty connection of a low-voltage auxiliary battery associated with a non-reversible voltage-controlled current source.

For this purpose, the invention proposes a method for detecting a faulty connection of a low-voltage auxiliary battery incorporated in an auxiliary network of a motor vehicle supplied by said auxiliary battery and by a non-reversible current source, such as a DC/DC voltage converter or an alternator, which is voltage controlled to supply an output voltage which is a function of the control setpoint voltages of said current source; according to the invention, this detection method consists of:
  determining at least one minimum and/or maximum voltage value which cannot be reached by the voltage at the terminals of the auxiliary battery,
  assigning the function of setpoint value to the minimum and/or maximum voltage value, and controlling the current source by sending said setpoint value to it,
  measuring the voltage at the terminals of the auxiliary network,
  and deducing a faulty connection of the auxiliary battery if there is a match between the measured voltage and the setpoint voltage.

It should be noted that, in the present patent application, the expression "maximum voltage value which cannot be reached by the voltage at the terminals of the auxiliary battery" signifies a voltage value at the terminals of a battery for a maximum output current of the voltage-controlled current source.

According to the invention, the first step is to determine, usually on the basis of measured and/or estimated parameters of the auxiliary battery, a minimum voltage value and/or a maximum voltage value equal to voltages that cannot physically be reached, given the characteristics of said auxiliary battery.

One of these voltage values is then used as the setpoint value applied to the current source, so that, if there is no faulty connection of the auxiliary battery,
  when the value of the setpoint voltage is minimal, an effective voltage reduction (discharge of the battery) takes place, and the measured voltage value at the terminals of the auxiliary network is greater than the setpoint voltage,
  when the value of the setpoint voltage is maximal, an effective overvoltage (charging of the battery) takes place, and the measured voltage value at the terminals of the auxiliary network is lower than the setpoint voltage.

On the other hand, according to this method, if there is a faulty connection of the auxiliary battery, the measured voltage value at the terminals of the auxiliary network matches the setpoint voltage value.

Consequently, this difference between the voltage values measured at the terminals of the auxiliary network, according to whether the auxiliary battery is correctly connected or is affected by a faulty connection, can be used to provide reliable information on the state of this connection.

It should also be noted that the use of this detection method simply requires the presence of a non-reversible current source, such as a DC/DC voltage converter or an alternator, in the auxiliary network of the motor vehicle. This method is therefore applicable not only to electric, hybrid or micro-hybrid motor vehicles, but also to thermal vehicles whose auxiliary network is conventionally supplied by an auxiliary battery and an alternator.

According to an advantageous embodiment for applying the method according to the invention to the detection of a faulty connection of a lead-acid battery with a nominal voltage of about 12 V, a minimum setpoint voltage value at least substantially within the range from 8 V to 10.5 V is selected.

Also in the context of a lead-acid battery with a nominal voltage of about 12 V, a maximum setpoint voltage value at least substantially within the range from 15 V to 16 V is advantageously selected according to the invention.

Additionally, in order to increase the reliability of the method according to the invention, the function of setpoint value is preferably assigned to a minimum voltage value which cannot be reached by the voltage at the terminals of the auxiliary network.

This is because, by selecting a minimum voltage value in this way, it is possible to confirm the decision regarding the state of connection of the auxiliary battery by measuring the strength of the current delivered at the output of the current source. In fact, when this selection is made, and if a faulty connection of the auxiliary battery is present, then, in addition to a match between the measured voltage and the setpoint voltage, a current flows at the output of the current source, and the measured current strength has the distinctive feature of being non-zero.

Conversely, if no faulty connection is present, then no current flows at the output of the current source, and this difference can be used to confirm the conclusions drawn from the voltage measurement.

BRIEF DESCRIPTION OF THE DRAWINGS

Other characteristic objects and advantages of the invention will be evident from the following detailed description which refers to the attached drawings, which represent a preferred embodiment of the invention by way of non-limiting example. In these drawings.

DETAILED DESCRIPTION OF THE INVENTION

Figure 1:
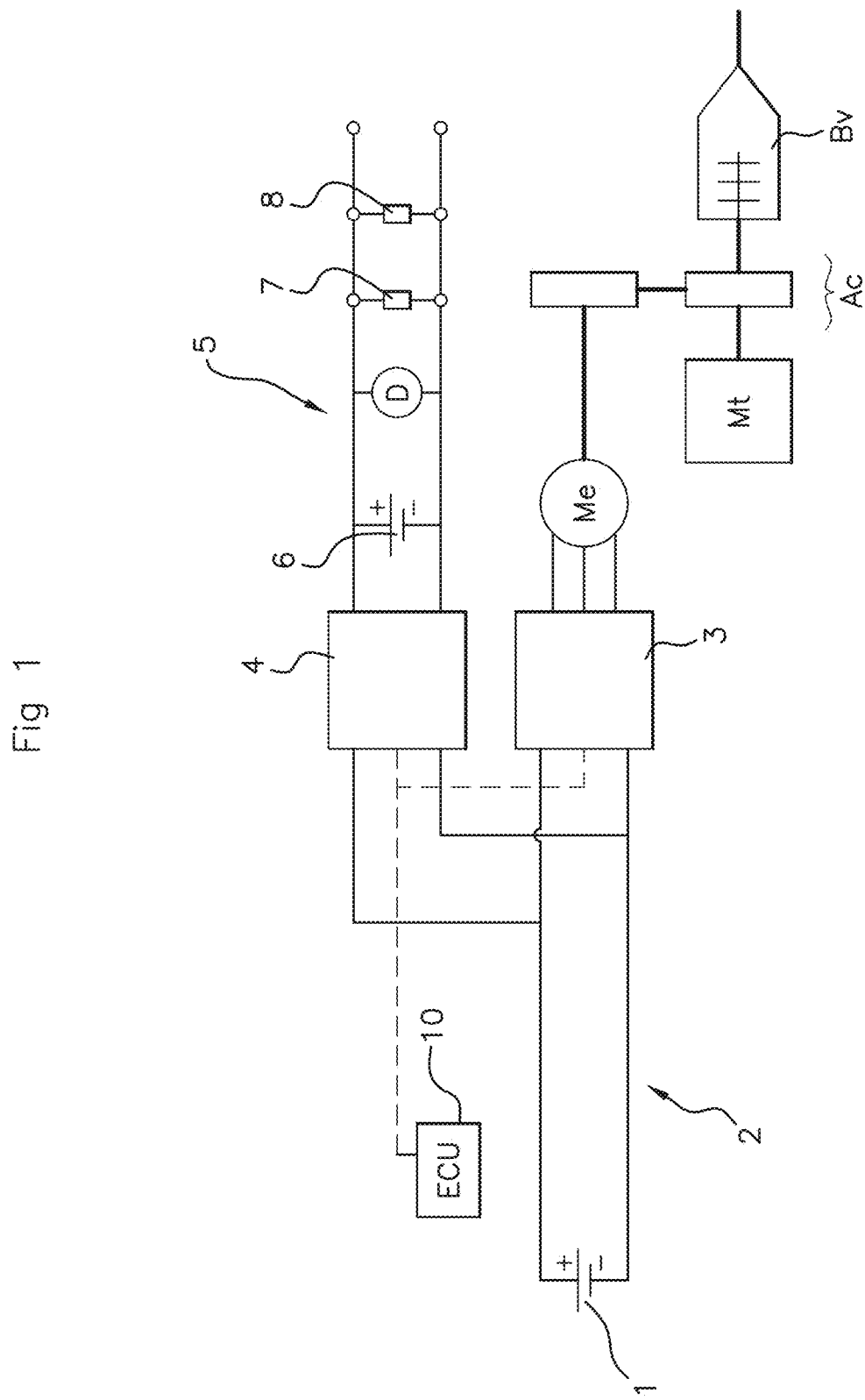
FIG. 1 shows an electrical diagram of a power supply circuit for an electric or hybrid vehicle.

The power supply circuit for an electric or hybrid motor vehicle shown in FIG. 1 comprises a first DC voltage source 1, supplying a primary circuit 2 including a DC/AC converter 3, for supplying an electric traction motor Me coupled to a thermal engine Mt by a coupling system A for transmitting driving torque to a gearbox By.

This power supply circuit also comprises a secondary circuit 5 forming the auxiliary network of the vehicle, supplied by a second DC voltage source 6, and comprising a starter D, sensitive loads such as 7 and insensitive loads such as 8, connected in parallel between the terminals of said voltage source.

Usually, the first voltage source 1, in a hybrid vehicle, consists of a battery or a set of batteries, for example a lithium-ion or Ni-MH battery, delivering a nominal voltage of 48 V, and the second voltage source 6 consists of a lead-acid battery delivering a nominal voltage of 12 V.

The primary circuit 1 and the secondary circuit 5 are connected to one another via a non-reversible DC/DC voltage converter 4 connected in parallel with the secondary circuit 5, and controlled by an electronic controller 10 capable of controlling said converter by sending voltage setpoints to it.

The method according to the invention proposes to detect any faulty connections of the second voltage source 6, and for this purpose it consists, in the first place, of determining at least one minimum and/or maximum voltage value which cannot be reached by the voltage at the terminals of the auxiliary battery 6.

In the case of a voltage source 6 consisting of a lead-acid battery with a nominal voltage of 12 V, such as those usually fitted in motor vehicles, the minimum value is advantageously selected to be in the range from 8 V to 10.5 V, while the maximum value is advantageously selected to be in the range from 15 V to 16 V.

When this selection has been made, the detection procedure is advantageously carried out while the vehicle is stationary or running at low speed, for example less than 15 km/h, the procedure consisting in controlling the converter 4 by sending it a voltage setpoint corresponding to one of said values, and then measuring the voltage at the terminals of the secondary circuit 5.

Figure 2A:
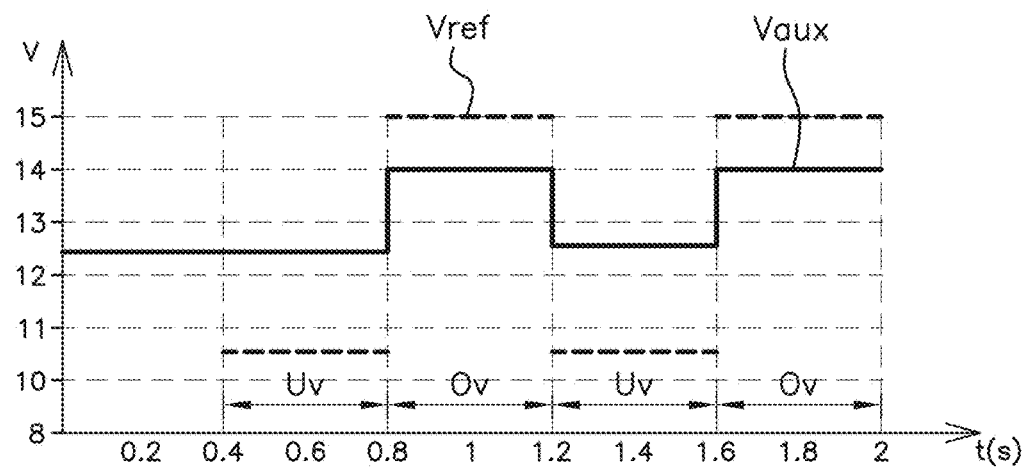
FIG. 2a is a diagram representing the results of the voltage measurements obtained when the detection method is applied in the absence of a faulty connection.
Figure 2B:
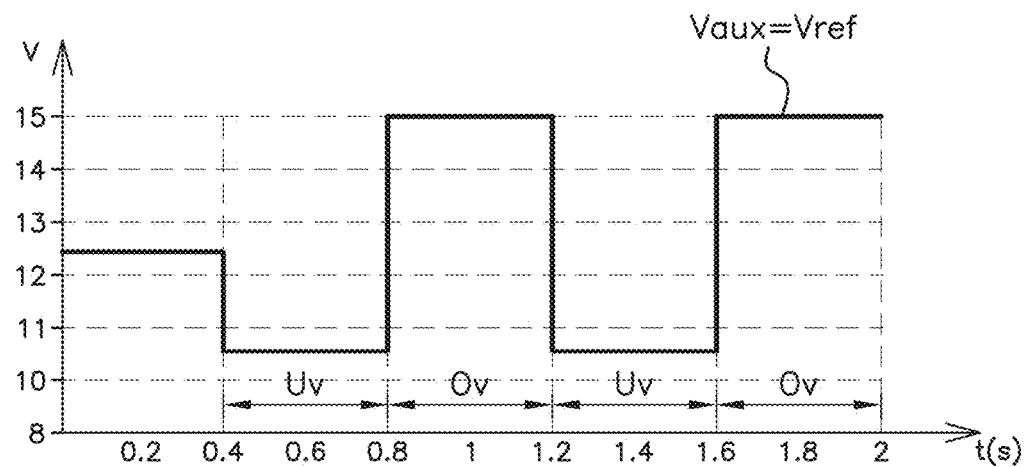
FIG. 2b is a diagram representing the results of the voltage measurements obtained when the detection method is applied in the presence of a faulty connection.

As shown in FIGS. 2a and 2b, when the setpoint voltage Vref corresponds to a minimum voltage value (8 V to 10.5 V):
  a voltage reduction takes place if the voltage source 6 is correctly connected, but the measured voltage value remains higher than the setpoint voltage Vref (sectors Uv in FIG. 2a),
  the measured voltage value is equal to the setpoint voltage if there is a faulty connection (sectors Uv in FIG. 2b).

As is also shown in FIGS. 2a and 2b, when the setpoint voltage Vref is equal to a maximum voltage value (15 V to 16 V):
  a voltage reduction takes place if the voltage source 6 is correctly connected, but the measured voltage value remains below the setpoint voltage Vref (sectors Ov in FIG. 2a),
  the measured voltage value is equal to the setpoint voltage if there is a faulty connection (sectors Ov in FIG. 2b).

Therefore, regardless of whether a minimum or a maximum value of the setpoint voltage Vref is chosen, a measured voltage identical to this setpoint voltage is a characteristic indication of a faulty connection of the voltage source 6.

Additionally, in order to confirm this conclusion, another step in the detection procedure is that of measuring the strength of the current delivered at the output of the converter 4 when the setpoint voltage Vref is equal to a minimum voltage value (8 V to 10.5 V):

This is because, when the setpoint voltage Vref is equal to a minimum voltage value,
  a faulty connection of the voltage source 6 is indicated by the flow of current at the output of the converter, and the measurement reveals a non-zero value of the current strength;
  the absence of a faulty connection is indicated by the absence of current at the output of the converter 4.

Thus, the result of the measurement of the current strength at the output of the converter 4 provides information that can be used to discriminate between the absence and the presence of a faulty connection, and to confirm the conclusions drawn from the voltage measurement.

The method according to the invention can therefore be used, by a simple software adaptation of the electronic controller 10, to detect a faulty connection of the voltage source 6 of the secondary circuit 5.

The invention claimed is:

1. A method for detecting a faulty connection of a low-voltage auxiliary battery incorporated in an auxiliary network of a motor vehicle supplied by said low-voltage auxiliary battery and by a non-reversible current source, the non-reversible current source being voltage-controlled to supply an output voltage which is a function of a control setpoint voltage of said non-reversible current source, the method comprising:
  determining at least one minimum or maximum voltage value, which cannot be reached by voltage at terminals of the low-voltage auxiliary battery, based on measured or estimated parameters of the low-voltage auxiliary battery;
  assigning the function of the control setpoint voltage corresponding to the minimum or maximum voltage value;
  controlling the non-reversible current source at the assigned control setpoint voltage that corresponds to the minimum or maximum voltage value that cannot be reached by the voltage at the terminals of the low-voltage auxiliary battery only when a faulty connection of the low-voltage auxiliary battery is to be detected;

measuring the voltage at the terminals of the auxiliary network;

comparing the measured voltage at the terminals of the auxiliary network with the control setpoint voltage; and determining the faulty connection of the low-voltage auxiliary battery when it is determined that there is a match between the measured voltage at the terminals of the auxiliary network and the control setpoint voltage, in the comparing the measured voltage with the control setpoint voltage.

2. The method as claimed in claim 1, wherein the auxiliary battery consists of a lead-acid battery with a nominal voltage of about 12 V, and further comprising selecting a minimum setpoint voltage value at least substantially within the range from 8 V to 10.5 V.

3. The detection method as claimed in claim 2, wherein the setpoint voltage is assigned to a minimum voltage value which cannot be reached by the voltage at the terminals of the auxiliary network.

4. The detection method as claimed in claim 3, wherein a strength of the current delivered at the output of the current source is measured, and the faulty connection of the auxiliary battery is deduced when, a) there is the match between the measured voltage and the setpoint voltage, and b) the measured strength of the current at the output of the current source has a non-zero value.

5. The method as claimed in claim 1, wherein the auxiliary battery consists of a lead-acid battery with a nominal voltage of about 12 V, and the method further comprises selecting a maximum setpoint voltage value at least substantially within the range from 15 V to 16 V.

6. The detection method as claimed in claim 5, wherein the setpoint voltage is assigned to a minimum voltage value which cannot be reached by the voltage at the terminals of the auxiliary network.

7. The detection method as claimed in claim 6, wherein a strength of the current delivered at the output of the current source is measured, and the faulty connection of the auxiliary battery is deduced when, a) there is the match between the measured voltage and the setpoint voltage, and b) the measured strength of the current at the output of the current source has a non-zero value.

8. The detection method as claimed in claim 1, wherein the setpoint voltage is assigned to a minimum voltage value which cannot be reached by the voltage at the terminals of the auxiliary network.

9. The detection method as claimed in claim 8, wherein a strength of the current delivered at the output of the current source is measured, and the faulty connection of the auxiliary battery is deduced when, a) there is the match between the measured voltage and the setpoint voltage, and b) the measured strength of the current at the output of the current source has a non-zero value.

10. The detection method as claimed in claim 1, wherein the non-reversible current source is one of a DC/DC voltage converter and an alternator.

* * * * *